United States Patent [19]
Federico et al.

[11] Patent Number: 4,519,024
[45] Date of Patent: May 21, 1985

[54] TWO-TERMINAL TRANSISTOR RECTIFIER CIRCUIT ARRANGEMENT

[75] Inventors: Joseph Federico, Berkeley Heights; Sigurd G. Waaben, Princeton, both of N.J.

[73] Assignee: AT&T Bell Laboratories, Murray Hill, N.J.

[21] Appl. No.: 528,899

[22] Filed: Sep. 2, 1983

[51] Int. Cl.³ .............................................. H02N 7/217
[52] U.S. Cl. ....................................... 363/127; 363/89
[58] Field of Search ...................... 363/84, 89, 127; 330/277; 323/266; 307/279, 296 R, 297

[56] References Cited

U.S. PATENT DOCUMENTS

| | | | |
|---|---|---|---|
| 3,798,531 | 5/1972 | Allington | 363/89 |
| 4,323,962 | 3/1982 | Steigerwald | 363/127 |
| 4,453,134 | 5/1984 | Perhyeszi | 330/252 |

FOREIGN PATENT DOCUMENTS

| | | | |
|---|---|---|---|
| 55-23706 | 2/1980 | Japan | 363/89 |
| 55-109174 | 8/1980 | Japan | 363/127 |
| 734576 | 5/1980 | U.S.S.R. | 363/89 |

OTHER PUBLICATIONS

Hewlitt Packard DC Power Supplies Catalog & Handbook, 1968, p. 52.
IBM Technical Disclosure Bulletin, vol. #23, No. 10, Mar. 1981.
R. S. Kagan et al., "Improving Power Supply Efficiency with MOSFET Synchronous Rectifiers", *Proceedings of Powercon 9, Ninth International Solid-State Power Electronics Conference*, Session D, Paper D-4, Jul. 1982, pp. 1-5.
S. Waaben, "FET Switching Devices for Powering of Telecommunications Circuits", *Intelec 81, Third International Telecommunications Energy Conference*, May 1981, pp. 250-252.

*Primary Examiner*—Peter S. Wong
*Assistant Examiner*—Judson H. Jones
*Attorney, Agent, or Firm*—David I. Caplan

[57] ABSTRACT

A two-terminal rectifier circuit, useful for converting an input a.c. voltage into an output d.c. voltage, is formed by a power MOSFET which is provided with an electrical feedback comparator network designed to turn on the MOSFET once during each a.c. cycle when the input a.c. voltage is nearly equal to its peak positive value.

16 Claims, 3 Drawing Figures

TWO-TERMINAL TRANSISTOR RECTIFIER CIRCUIT ARRANGEMENT

FIELD OF THE INVENTION

This invention relates to the field of semiconductor electronic circuits and more particularly to such circuits using transistors for a.c. to d.c. current conversion.

BACKGROUND OF THE INVENTION

In the art of semiconductor electronics, very large scale integrated (VLSI) circuits typically require power sources of relatively small positive d.c. voltages, in the past typically about +5 volts. As the integrated circuit art progresses, even smaller d.c. voltages are becoming typical. In many situations, however, the only conveniently available power sources are a.c. voltage sources, typically having more than 5 volt peaks. For use by an integrated circuit requiring a power supply of 5 volts d.c., the a.c. voltage can be stepped down by a conventional transformer to about 5 volts peak a.c., and this 5 volt peak a.c. voltage must then be converted to 5 volts d.c. To this end, a semiconductor rectifier circuit can be used, typically a peak detector diode arrangement—that is, a pn junction diode feeding a capacitive load. One basic problem in such an arrangement arises from the forward junction diode voltage drops (about 0.7 volt or more in silicon) encountered in such a conventional peak detector diode arrangement. Thus, for an input a.c. voltage of peak E=5.0 volts, the output voltage is less than about 4.3 volts, that is, in the range of about 0.7 volt to 1.0 volt or more below E for semiconductor junctions in silicon. As a consequence, undesirably large power losses result.

For alleviating this problem, one approach of prior art, as illustrated in FIG. 1, is taught in "Improving Power Supply Efficiency with MOSFET Synchronous Rectifiers," by R. S. Kagan et al, *Proceedings of Powercon 9, Ninth International Solid-State Power Electronics Conference* (July 1982), Session D, Paper D-4, pp. 1–5, at p. 4, Sections 6.1–6.3. Briefly, in that approach as shown in FIG. 1, a full-wave rectifier circuit arrangement 10 includes a pair of power MOSFETs (Metal Oxide Semiconductor Field Effect Transistor) 101 and 102, each hereinafter called a "power FET." Secondary transformer windings 111 and 121, energized by primary transistor windings 11, deliver a.c. input to the power FETs. Each power FET is inherently connected in parallel with its inherent unidirectional current inhibiting diode characteristic (indicated by dotted lines in FIG. 1), and each such power FET is connected in a conventional diode peak rectifier arrangement with respect to the input supplied to secondary transformer windings 111 and 121, respectively, and feeds output power to a resistive load (not shown) connected in parallel with a capacitive load $C_L$. To reduce the forward diode voltage drop, each power FET is turned on periodically by means of a sample (feed-forward) of the a.c. input delivered to the gate terminal of the FET. More specifically, the gate electrode of each power FET is fed input by an auxiliary a.c. voltage developed by auxiliary secondary transformer windings 112 and 122, respectively. Thereby one of the power FETs (101) is turned on, and is maintained on, only in a time-neighborhood of the peak of the a.c. input cycle, i.e., only when the a.c. input is at or near its peak (maximum) value; and the other of the power FETs (102) is turned on, and is maintained on, only in the neighborhood of each trough (minimum) of the a.c. cycle. In this way, the output voltage $E_{OUTPUT}$ developed across an output load having a capacitive loading $C_L$ desirably does not suffer from a full forward diode voltage drop. However, the gate-to-source voltage of the power FET thus varies as $(E_1 - E_2) \sin(2\pi f t)$, where $E_1$ and $E_2$ are the peak voltages, respectively, delivered by the auxiliary transformer windings to the gate and source of the power FET, where f is the frequency of the a.c. input, and t is the time. Therefore, each turning on (and temporary remaining on) of the power FET at and near the peak of each a.c. cycle, when $\sin(2\pi f t)$ approaches its maximum value of unity, is not a sudden process, but is characterized by the relatively smooth and long transition characteristic of $(E_1 - E_2) \sin(2\pi f t)$ when $\sin(2\pi f t)$ is approximately equal to $\pm 1$. Accordingly, undesirably large amounts of energy are lost in the power FET during each a.c. cycle because of relatively large currents flowing therethrough (during the slow transitions) during time intervals when $\sin(2\pi f t)$ is very nearly equal to $\pm 1$, i.e., intervals when the voltage drop across the FET is not negligible.

Another approach is taught by S. Waaben, one of the inventors herein, in a paper entitled "FET Switching Devices for Powering of Telecommunications Circuits," published in *Proceedings of Intelec* 81, pp. 250–252, Third International Telecommunications Energy Conference (May 1981). In that approach, a photoemitter (light-emitting diode) controlled the on-off condition of a photodetector which, in turn, controlled the on-off condition of a "power FET" arranged in a conventional peak rectifier arrangement, i.e., an arrangement of the power FET (with its inherent unidirectional current inhibiting diode characteristic) feeding a capacitive output load. Specifically, the timing of the on-off condition of the photoemitter was arranged to control the timing of the power FET in a manner similar to the timing discussed above in connection with FIG. 1. Rectifier operation resulted in which voltage and power losses—otherwise caused by semiconductor diode junction forward voltage drops and by slow on-off transitions of the power FET—could be reduced substantially. However, the use of the optical control technology (photoemitters and photodetectors) means that the circuit was a three-terminal device including ground (one optical terminal and two electronic terminals) and entails obvious disadvantages in complexity and cost.

Therefore, it would be desirable to have a rectifier circuit arrangement which mitigates these problems of prior art.

SUMMARY OF THE INVENTION

This invention involves a two-terminal semiconductor rectifier circuit arrangement (200; FIG. 2) with reduced voltage and power losses. The circuit comprises a transistor device (201), advantageously a power transistor, connected between a circuit input terminal (231) of the rectifier circuit (200) and a circuit output terminal (232) thereof, and a comparator (203) whose output terminal (215) is connected to the gate electrode terminal (221) of the transistor device (201) for supplying feedback thereto. A high current source terminal (222) of the transistor device (201) is connected to the circuit input terminal (231); a high current drain terminal (223) thereof is connected to the circuit output terminal (232). A positive input terminal (211) of the comparator (203) is connected to the rectifier circuit input terminal (231), and a negative input terminal (212) of the comparator (203) is connected to the rectifier circuit output terminal (232). An output load device, to which the circuit output terminal (232) is to be connected, includes output load capacitance ($C_L$) to ground. The comparator (203) includes a voltage level shifter (204) for changing by a prescribed amount the voltage applied to one of the comparator's input terminals, for example, for down-shifting the voltage applied to the comparator's negative input terminal (212), whereby during operation, the transistor device is on during and only during a time interval of each cycle of the a.c. input during which the a.c. input voltage is equal to or greater than the peak of the a.c. input voltage less the prescribed amount. Advantageously, power is supplied to this comparator at its power supply terminal (214) from an output terminal of a voltage multiplier arrangement, typically a voltage doubler comprising a pair of undirectional semiconductor junction diodes ($D_1$, $D_2$) and a pair of capacitors ($C_1$, $C_2$) connected together in a ladder configuration stemming from the rectifier circuit input terminal (231). One of these capacitors ($C_1$) is connected between the circuit output terminal (232) and ground, i.e., in parallel with the output load capacitance ($C_L$). If the load device itself contains sufficient output load capacitance ($C_L$), one of the capacitors ($C_1$) can be omitted since it is connected in parallel with the output load capacitor ($C_L$). The transistor device (201) advantageously is a power transistor, typically a conventional power FET, which inherently has a source-drain diode characteristic, and such a diode characteristic of the power FET, if of sufficient value, can supplant the first diode $D_1$. In this way (excluding ground), a two-terminal rectifier circuit arrangement is provided in which, when an a.c. input voltage $E_{INPUT} = E \sin(2\pi ft)$ is applied to the rectifier circuit input terminal (231), a relatively steady output voltage $E_{OUTPUT}$ substantially equal to E is developed at the circuit output terminal (232) across the capacitive output load $C_L$.

In a specific embodiment of the invention, the power transistor is a power FET ($T_1$, 301), while the comparator (303, FIG. 3) includes:

a switching transistor ($T_2$) whose source-drain path is connected between the circuit input terminal and the gate terminal of the power FET ($T_1$);

a first load device ($T_3$), connected between the gate control terminal (321) of the power transistor device and the output terminal of the voltage doubler arrangement, for supplying a first current to the gate terminal of the power FET;

a resistance element ($R_1$) having one terminal connected to the rectifier circuit output terminal (332) and another terminal connected to a control terminal of the switching transistor ($T_2$); and a second load device ($T_4$), connected between a control terminal of the second transistor ($T_2$) and another terminal of the resistance element ($R_1$), for supplying a second current to the resistance element ($R_1$).

BRIEF DESCRIPTION OF THE DRAWING

This invention together with its features, characteristics, and objects may be better understood from the following detailed description when read in conjunction with the drawing in which.

Elements of FIGS. 1, 2, and 3 which are the same are denoted by the same reference numerals. Elements of FIG. 3 which are similar to those of FIG. 2 are denoted by the same reference numerals plus one hundred.

DETAILED DESCRIPTION

Figure 2:
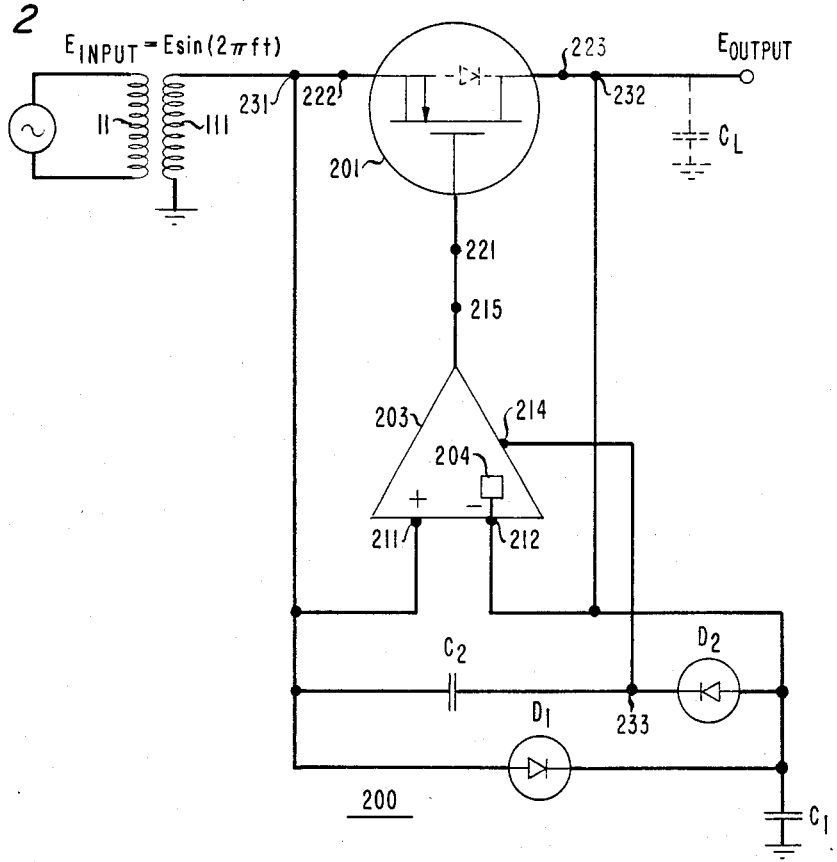
FIG. 2 is circuit schematic diagram of a rectifier circuit arrangement in accordance with the invention.

FIG. 2 shows a rectifier circuit arrangement 200 (half-wave portion) for delivering d.c. power to an output circuit terminal 232, including a transistor device 201. This transistor device 201 has one of its high current carrying terminals 222 connected to the rectifier circuit input terminal 231 and another of its high current carrying terminals 223 connected to the rectifier circuit output terminal 232. An a.c. input voltage $E_{INPUT} = E \sin(2\pi ft)$ is supplied at the circuit input terminal 231 by secondary transformer windings 111. The transistor 201 is advantageously a power transistor, that is, capable of handling power levels of the order to the power delivered to the circuit output terminal 232. This transistor 201 typically is a power FET having an inherent unidirectional current inhibiting diode characteristic indicated by the dotted line therein. A first unidirectional current inhibiting semiconductor junction diode $D_1$ can be added in parallel with the transistor 201 in case this transistor lacks sufficient forward current handling capacity when it is off. A first capacitor $C_1$ is connected between the first diode $D_1$ and ground; but it should be understood that this first capacitor $C_1$ can be omitted in case the output capacitance $C_L$ (shown in dotted lines) of the output load circuit (not shown) is sufficient to smooth out the voltage at the output terminal 232. Thus, the first diode $D_1$, in combination with the first capacitor $C_1$ (and/or the output capacitance $C_L$), forms a conventional peak detector and even in the absence of the transistor 201 would supply a d.c. voltage at the circuit output terminal 232; however, such a d.c. voltage as supplied by the peak detector is less than the peak E of the a.c. input by an undesirably large amount, that is, by the amount of the forward junction drop in the diode $D_1$. To reduce this undesirably large amount, the transistor device 201 is added together with control circuitry for controlling the voltage at the control terminal 221 thereof.

The on-off condition of the transistor 201 is controlled by output from the comparator 203 developed at the comparator's output terminal 215 and delivered to the control terminal 221 of the transistor 201. The comparator 203 has a positive input terminal 211 connected to the circuit input terminal 231 and a negative input terminal 212 connected to the circuit output terminal 232. The negative input terminal 212 is connected to a voltage level shifter 204 which down-shifts the voltage level of the negative input terminal 212 by a prescribed amount δ for comparison with the voltage level of the positive terminal 211. That is, the output of the comparator 203 at the comparator output terminal is relatively high when and only when the voltage at the positive input terminal 211 plus the prescribed amount δ exceeds the voltage $E_{OUTPUT}$ at the negative input terminal 212. Thus, the output of the comparator shifts from low to high when $E \sin(2\pi ft)$ goes higher than ($E_{OUTPUT} - δ$), or $E \sin(2\pi ft) + δ$ exceeds $E_{OUTPUT}$. A second junction diode $D_2$ and a second capacitor ($C_2$) are connected in series across the circuit input and output terminal 231 and 232, respectively. Power for the comparator 203 is supplied at the comparator's power supply terminal 214 from a terminal 233 located btween the second junction diode $D_2$ and the second capacitor $C_2$.

It should be noted that the diodes $D_1$ and $D_2$ together with the capacitors $C_1$ and $C_2$ form a voltage multiplier (doubler) ladder arrangement: the voltage at the multiplier's output terminal 233, and hence at the comparator's power supply terminal 214 relative to ground, is equal to $2E + E \sin(2\pi ft)$ less the sum of the forward diode voltage drops across $D_1$ and $D_2$, and hence relative to the circuit input terminal 231 is equal to $2E$ less the sum of the forward diode voltage drops across $D_1$ and $D_2$.

During operation, the unidirectional diode characteristic (if any) inherent in the transistor device 201 plus the unidirectional diode characteristic of the first diode $D_1$, in combination with $C_1 + C_L$ in a diode peak detector arrangement, bring the output voltage $E_{OUTPUT}$ at the circuit output terminal 232 to a steady d.c. voltage of $E$ less a forward diode junction voltage drop (provided that $C_1 + C_L$ is sufficient), typically 5.0 volts less 0.7 volt or more, i.e., typically 4.3 volts or less. When the voltage of $E_{INPUT} = E \sin(2\pi ft)$ exceeds $E_{OUTPUT} - \delta$, the transistor device 201 turns on and brings the output voltage $E_{OUTPUT}$ substantially to $E - \delta$. Hence, the transistor 201 turns on when $E \sin(2\pi ft)$ exceeds $E - 2\delta$. For example, if $E = 5.0$ volts and $\delta = 0.1$ volt, then $E_{OUTPUT} = 4.9$ volts instead of the 4.3 volts or less resulting from the diode peak detecting arrangement alone. By adjusting $\delta$, the output can be correspondingly adjusted. However, the value of $\delta$ is selected to be not too small, lest the time duration of the on condition of the power FET be too small for delivering sufficient charge to the output terminal, and not too large, lest the output voltage be undesirably too much lower than $E$.

Figure 3:
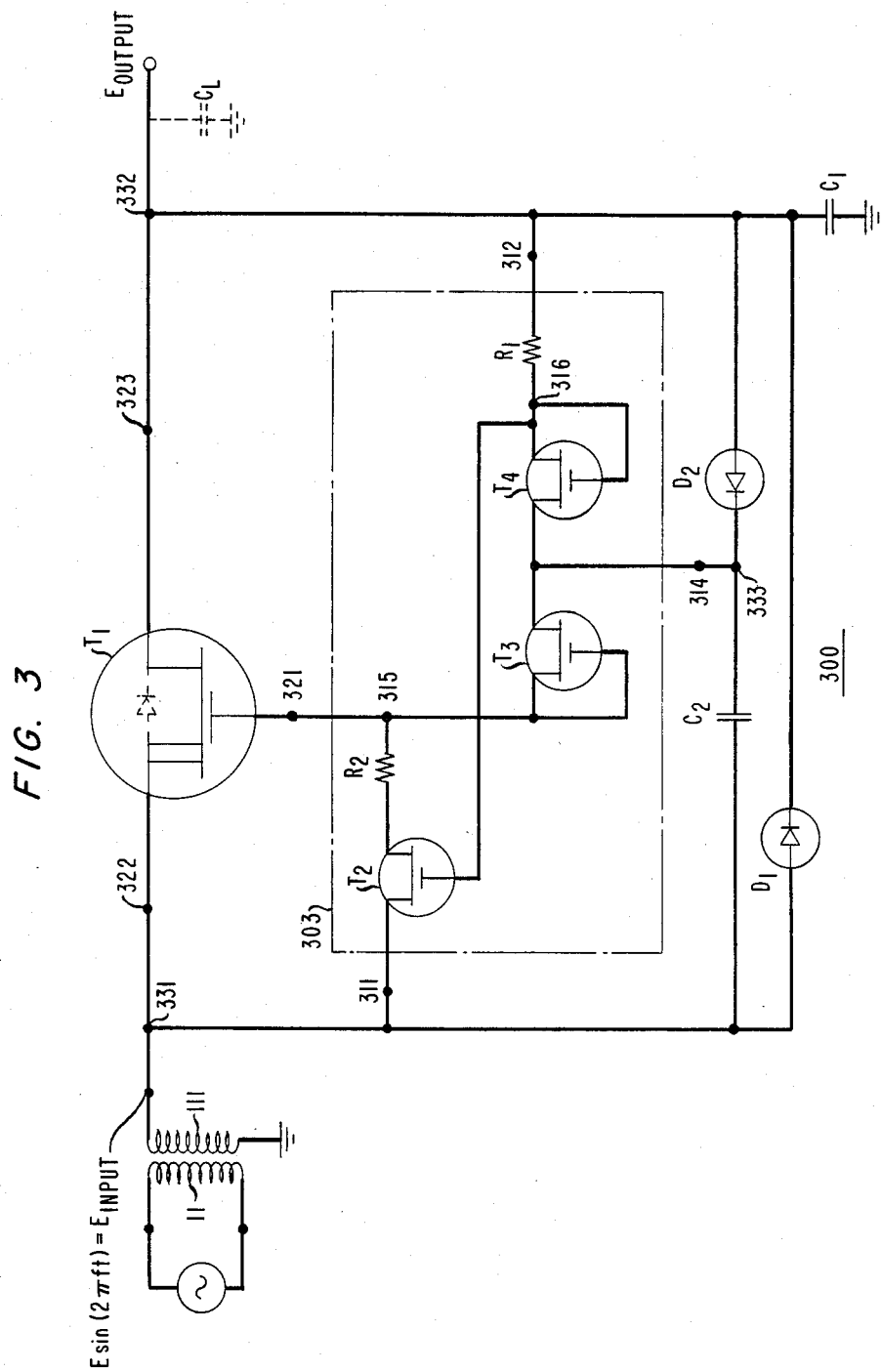
FIG. 3 is circuit schematic diagram of a rectifier circuit arrangement in accordance with a specific embodiment of the invention.

FIG. 3 shows a specific embodiment of the invention, particularly as to the details of a specific comparator. As shown in FIG. 3, a rectifier circuit arrangement 300 (half-wave portion) having a circuit input terminal 331 and a circuit output terminal 332, comprises a power FET 301 ($T_1$) with its source terminal 322 connected to the circuit input terminal 331, its drain terminal 323 connected to the circuit output terminal 332, and its gate terminal 321 connected to an output terminal 315 of a comparator 303. The power FET 301 has a threshold of about 2.5 volts and inherently has a unidirectional current inhibiting diode characteristic (indicated by dotted lines) which shunts the source terminal 322 to the drain terminal 323 of the power FET ($T_1$).

The purpose of the comparator 303 is to deliver feedback to the gate of the power FET to control its on-off condition suitably, as more fully described below. The comparator 303 has a power supply terminal for receiving power from an output terminal 333 of a voltage doubler arrangement. The voltage doubler comprises a pair of capcitors $C_1$ and $C_2$ connected in a ladder configuration to a pair of unidirectional current inhibiting diodes $D_1$ and $D_2$.

The comparator 303 includes a switching transistor $T_2$, local transistors $T_3$ and $T_4$, and resistors $R_1$ and $R_2$. The switching transistor $T_2$ is enhancement mode with a relatively sharp threshold of about 2.5 volts; and the transistors $T_3$ and $T_4$, connected as load devices (gate shorted to source), are depletion mode with source-drain currents in the saturation region (drain-source voltage above about 3 volts) of about 3 milliamps for zero gate voltages.

The capacitance of $C_1$ can be supplied by the output load capacitance $C_L$ itself or by an added capacitor element such that the sum of $C_1$ and $C_L$ is equal to the gate capacitance of the power FET 301 multiplied by a factor of about 5 or more for advantageous performance. The capacitance of $C_2$ is advantageously supplied by an added capacitor element having a capacitance of at least 5 times that of the gate capacitance of the power FET 301. The diode $D_1$ is in parallel with the inherent diode characteristic (dotted line) of the power FET 301. Thus, the diode $D_1$ is not necessarily present in the circuit 300 as a separate element but is ordinarily supplied by the inherent diode characteristic of the power FET 301. However, in case a power transistor lacking such a diode characteristic is used instead of the power FET, then an added diode element $D_1$ is advantageously to be added as a separate element.

It should be noted that the circuit output terminal is fed current both by the inherent diode of the power FET and the source-drain path of the power FET itself if and when it is on, as well as by the diode $D_1$. Thus, the voltage $E_{OUTPUT}$ at the circuit output terminal 332 is maintained not only by the power FET but also by the diode $D_1$.

During operation, as more fully explained below, the transistor $T_2$ is off when and only when the instantaneous value of the a.c. voltage at the circuit input terminal 331 is at or near its peak, that is, when $E_{INPUT} = E \sin(2\pi ft)$ is equal to $E_{OUTPUT} - \delta$, and the switching transistor $T_2$ is otherwise on. Thus, whenever the instantaneous value of the a.c. input voltage $E \sin(2\pi ft)$ at the circuit input terminal 331 is at or near its peak value and hence $T_2$ is off, then the voltage of the gate electrode terminal 321 of the power FET 301 is driven by transistor load $T_3$ (acting as a current source) to the voltage of terminal 333, i.e., to the voltage $2E$ plus the voltage at circuit input terminal 331 less the relatively small voltage drop across $D_2$ and accordingly the power FET is then strongly on, since its gate voltage then exceeds its source voltage by almost $2E$, i.e., almost about 10 volts (much more than the threshold of the power FET). On the other hand, whenever the a.c. input voltage is not at or near its peak value, the switching transistor $T_2$ is on, as explained more fully below, and hence the gate voltage of the power FET is then clamped by $T_2$ to a value below threshold of the power FET, more specifically, essentially to the voltage at the circuit input terminal 331 and hence to the voltage at the source terminal 322 of the power FET 301. Thus the power FET is off when the a.c. input voltage is not at or near its peak. By "essentially" here is meant excluding the relatively small voltage drop across the resistor $R_2$ equal to the current through the load $T_3$ multiplied by $R_2$. For a resistance of $R_2$ equal to typically about 200 ohms or less, this voltage drop across $R_2$ is thus equal to about 0.6 volt or less, and this nonvanishing resistance reduces the voltage excursion of the gate of the power FET during each a.c. cycle and hence reduces the power loss in the gate circuit of the power FET. If such power loss is unimportant, $R_2$ can be made equal to zero. In any event, the drop across $R_2$ should be small enough to keep the power FET off when $T_2$ is on.

During operation, the switching transistor $T_2$ turns off (and hence the power FET $T_1$ turns on) at a time $t_1$ when the voltage at the gate of $T_2$ (and hence the voltage at terminal 316 of resistor $R_1$) attains a value which is equal to the instantaneous a.c. input voltage, $E_{INPUT} = E \sin (2\pi f t_1)$ plus a threshold voltage $V_T$ of $T_2$, i.e., when the voltage at terminal 316 attains $E \sin (2\pi f t_1) + V_T$. On the other hand, the voltage at terminal 316 is equal to $E_{OUTPUT} + iR_1$, where i is the current supplied by the load $T_4$. Since the output voltage $E_{OUTPUT}$ itself is equal to $E - \delta$, it follows that the switching transistor $T_2$ turns off at a time $t_1$ when $E \sin (2\pi f t_1) + V_T = E - \delta + iR_1$, i.e., at a time $t_1$ when:

$$E \sin (2\pi f t_1) = E - \delta + iR_1 - V_T \quad (1)$$

Likewise, as the a.c. input voltage subsequently decreases from its peak E, the switching transistor $T_2$ turns on at a time $t_2$ when the a.c. input voltage falls (from the peak) to this same value of $E_{INPUT}$, i.e., at a subsequent time $t_2$ when $\sin (2\pi f t_2) = \sin (2\pi f t_1)$. Accordingly, $E_{OUTPUT}$ will be substantially equal to $E - \delta$ provided the capacitance $C_L + C_1$ is sufficient to maintain the voltage at the output terminal 332 at substantially this same value during the remainder of the a.c. cycle when $T_2$ is on and hence the power FET is off. Thus, setting $E \sin (2\pi f t_1)$ substantially equal to $E - 2\delta$ in Equation (1), it follows that $iR_1$ is equal to $(V_T - \delta)$, i.e., $\delta = V_T - iR_1$. In an illustrative case, the current i supplied by the load $T_4$ is equal to about 3 milliamps, and the threshold $V_T$ of switching transistor $T_2$ is equal to about 2.5 volts, so that if $R_1$ is set equal to about 800 ohms, then $\delta$ is about 0.1 volt.

Accordingly, the comparator 303 acts as an ordinary comparator which delivers a high level output (a voltage equal to approximately 2E above the instantaneous a.c. input) when the input ($E_{INPUT}$) delivered to one of its input terminals (311) exceeds the input (E) delivered to another of its input terminals (312) less the prescribed amount $\delta$, and which delivers a low level output (essentially equal to the instantaneous a.c. input) otherwise. In other words, the comparator 303 includes a level shifting property at its negative input terminal 312, to wit, a voltage level down-shift of $\delta$. This down-shift property is thus incorporated in the comparator 203 of FIG. 2 as the voltage level shifter 204. In any event, this level shifter 204 should be selected to down-shift the voltage applied to the input terminal 212 of the comparator 203 by a (small) prescribed amount, such that the comparator 203 delivers its high level output at its output terminal 215 to the gate electrode terminal 221 of the power FET 201 when and only when the input voltage to the input terminal 211 of the comparator 203 exceeds the peak of the a.c. input voltage delivered at the circuit input terminal 231 less the (small) prescribed amount $\delta$. Typically the prescribed amount is about 0.1 volt for a 5 volt peak E of an a.c. input voltage applied at the circuit input terminal 231.

It should be noted that even though the approach of $E_{INPUT}$ to its peak E is relatively slow in time because of its approach to a maximum, nevertheless the turning off of the switching transistor $T_2$, as $E_{INPUT}$ reaches E less the (small) prescribed amount $\delta$, is a well-defined sudden process. The suddenness of the process results from the well-defined threshold of transistor $T_2$. Thus the transistor $T_2$ advantageously has a relatively sharp threshold, that is, the source-drain impedance of $T_2$ has a relatively steep characteristic as plotted against its gate-to-source voltage.

Figure 1:
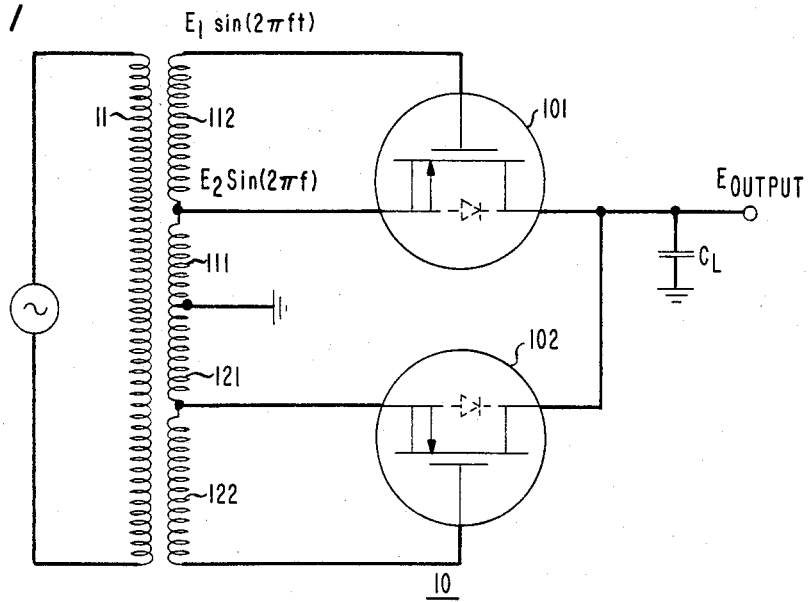
FIG. 1 is circuit schematic diagram of a rectifier circuit arrangement of prior art.

It should be recognized that the rectifier circuit arrangements 200 and 300 are half-wave rectifiers and that, for full-wave rectification, and hence still smoother $E_{OUTPUT}$, a pair of each of such circuits should be connected in a conventional full-wave rectifier configuration in accordance with that of FIG. 1.

Although the invention has been described in detail in terms of a specific embodiment, various modifications can be made without departing from the scope thereof. For example, instead of the power FET, other switching transistors with suitable power handling capability and suitable threshold can be used. Moreover, instead of a voltage doubler ($D_1$, $D_2$, $C_1$, $C_2$), a voltage tripler or other source can be used. Finally, instead of a level down-shifter at the negative input terminal of the comparator, a level up-shifter at its positive input terminal can be used.

What is claimed is:

1. A rectifier comprising:
   (a) a power transistor device having a first high current carrying terminal serving as a rectifier output terminal and a second high current carrying terminal serving as a rectifier input terminal, and having a low current carrying control terminal for turning the transistor on and off; and
   (b) comparator feedback means having first and second feedback input terminals connected to the rectifier input and output terminals, respectively, and having a feedback output terminal connected to the control terminal of the power transistor for supplying feedback to the control terminal device whereby the power transistor turns on when the voltage at the input terminal exceeds the voltage at the output terminal less a prescribed amount.

2. A semiconductor rectifier circuit arrangement for converting an a.c. input with a d.c. output comprising:
   (a) a transistor device having first high current terminal for connection to the a.c. input, a second high current terminal for delivering the d.c. output to a circuit output terminal, and a gate electrode terminal; and
   (b) comparator means having an output terminal connected to the gate terminal, a first input terminal connected to the first high current terminal of the power transistor, and a second input terminal connected to the second high current terminal of the transistor device,
   the comparator means also having a level shifting means for changing the level of voltage applied to one of the input terminals of the comparator means by a prescribed amount, whereby during operation in response to the a.c. input the transistor device is kept on during a time interval of each cycle of the a.c. input during which the a.c. input voltage is greater than the peak of the a.c. input voltage less the prescribed amount.

3. The rectifier circuit arrangement of claim 2 in which the level shifting means is connected for down-shifting the voltage level of input applied to the second input terminal of the comparator means.

4. A semiconductor rectifier circuit in accordance with claim 2 further comprising voltage multiplier means connected between the circuit input terminal and a power supply terminal of the comparator.

5. The circuit of claim 4 in which the multiplier means includes a first capacitance means and a first unidirectional diode means connected between the circuit input terminal and a first terminal of the first capacitance means.

6. The circuit of claim 5 in which the first terminal of the first capacitance means is connected to the circuit output terminal.

7. A semiconductor rectifier circuit arrangement in accordance with claim 5 in which the transistor device is a power FET.

8. An arrangement according to claim 3 in which the transistor device is a power FET.

9. An arrangement according to claim 3 further comprising a capacitance means connected between the circuit input terminal and a power supply input terminal of the comparator means and unidirectional current inhibiting diode means connected between the circuit output terminal and the power supply input terminal of the comparator means.

10. The arrangement of claim 9 in which the transistor device is a power FET.

11. A semiconductor rectifier circuit arrangement comprising:
   (a) a power transistor having a control terminal and a pair of high current controlled terminals, one of its high current terminals being connected to a circuit output terminal and the other of its high current terminals being connected to a circuit input terminal;
   (b) a capacitor connected between the circuit input terminal and a power supply terminal of a comparator;
   (c) a unidirectional current inhibiting device connected between the circuit output terminal and the power supply terminal;
   (d) the comparator comprising the power supply terminal, and having a first input terminal thereof connected to the circuit input terminal, a second input terminal thereof connected to the circuit output terminal, and an output terminal thereof connected to a control terminal of the power transistor, the comparator further comprising:
      (1) a switching transistor, having a prescribed threshold voltage, whose source-drain path is connected between the circuit input terminal and the gate terminal of the power transistor;
      (2) a resistor having one terminal connected to the second comparator input terminal;
      (3) means for connecting a control terminal of the switching transistor to another terminal of the resistor;
      (4) a first current source means, connected between the power supply terminal and the one terminal of the resistor, for supplying current to the resistor, whereby the voltage at the one terminal of the resistor differs from that at the other terminal of the resistor by a prescribed amount; and
      (5) a second current source means, connected between the power supply terminal of the comparator and the control terminal of the power transistor, for maintaining the voltage of the control terminal at a relatively high level, as compared with the voltage at the circuit input terminal, when the switching transistor is in its off condition.

12. The arrangement of claim 11 in which the first and the second current source means each comprises a separate transistor load device.

13. An arrangement according to claim 11 further comprising voltage multiplier means, connected between the circuit input terminal and the power supply terminal of the comparator, for maintaining the voltage of the power supply terminal above that of the circuit input terminal by a predetermined amount.

14. An arrangement according to claim 13 further comprising a unidirectional current inhibiting device connected between the power supply terminal and the circuit output terminal.

15. An arrangement according to claim 12 further comprising voltage multiplier means, connected between the circuit input terminal and the power supply terminal of the comparator, for maintaining the voltage of the power supply terminal above that of the circuit input terminal by a predetermined amount.

16. An arrangement according to claim 15 further comprising a unidirectional current inhibiting device connected between the power supply terminal and the circuit output terminal.

* * * * *

UNITED STATES PATENT AND TRADEMARK OFFICE
CERTIFICATE OF CORRECTION

PATENT NO. : 4,519,024

DATED : May 21, 1985

INVENTOR(S) : Joseph Federico and Sigurd G. Waaben

It is certified that error appears in the above-identified patent and that said Letters Patent is hereby corrected as shown below:

Column 2, line 65, "231" should read --232--.

Signed and Sealed this

Fifth Day of November 1985

[SEAL]

Attest:

Attesting Officer

DONALD J. QUIGG

Commissioner of Patents and Trademarks